(12) United States Patent
Schneider et al.

(10) Patent No.: US 9,825,615 B2
(45) Date of Patent: Nov. 21, 2017

(54) METHOD FOR OPERATING AN INVERTER OF AN ELECTRICAL REFRIGERANT COMPRESSOR MAKING USE OF DC LINK ELECTROLYTE CAPACITORS

(71) Applicant: VISTEON GLOBAL TECHNOLOGIES, INC., Van Buren Township, MI (US)

(72) Inventors: Gangolf Schneider, Erft (DE); Mario Lenz, Kerpen (DE); Stefan Tydecks, Köln (DE)

(73) Assignee: HANON SYSTEMS, Daejeon-si (KR)

(*) Notice: Subject to any disclaimer, the term of this patent is extended or adjusted under 35 U.S.C. 154(b) by 645 days.

(21) Appl. No.: 13/934,346

(22) Filed: Jul. 3, 2013

(65) Prior Publication Data

US 2014/0008998 A1    Jan. 9, 2014

(51) Int. Cl.
*G01R 1/20* (2006.01)
*H03K 3/01* (2006.01)
*B60K 1/00* (2006.01)
*H02M 7/48* (2007.01)
*G06F 1/28* (2006.01)
*H02M 7/5387* (2007.01)

(52) U.S. Cl.
CPC ............... *H03K 3/01* (2013.01); *B60K 1/00* (2013.01); *H02M 7/48* (2013.01); *G06F 1/28* (2013.01); *H02M 7/53875* (2013.01); *Y10T 307/773* (2015.04)

(58) Field of Classification Search
CPC .. B60K 1/00; H02P 27/00; H02H 7/00; F04B 35/04; H03M 1/00
USPC ............... 307/154, 80, 82, 66, 64, 43, 109; 361/23, 22, 30; 417/410.1, 410.5; 318/139
See application file for complete search history.

(56) References Cited

U.S. PATENT DOCUMENTS

| | | | |
|---|---|---|---|
| 5,371,645 A * | 12/1994 | Mochizuki | H02H 7/0833 361/22 |
| 6,384,558 B2 | 5/2002 | Yoshida et al. | |
| 6,820,437 B2 | 11/2004 | Goto et al. | |
| 6,838,839 B2 | 1/2005 | Goto et al. | |
| 7,425,806 B2 | 9/2008 | Schnetzka et al. | |
| 7,859,207 B2 | 12/2010 | Yamada et al. | |
| 2003/0084673 A1* | 5/2003 | Moon | F24F 11/0079 62/184 |
| 2004/0074255 A1* | 4/2004 | Goto | B60H 1/00428 62/498 |
| 2004/0118144 A1 | 6/2004 | Hsu et al. | |
| 2006/0103342 A1 | 5/2006 | Mechi | |

(Continued)

FOREIGN PATENT DOCUMENTS

EP    EP 1983640 A2 * 10/2008    ............ H02M 5/451
JP    2006166569 A  *  6/2006

*Primary Examiner* — Rexford Barnie
*Assistant Examiner* — Jagdeep Dhillon
(74) *Attorney, Agent, or Firm* — Shumaker, Loop & Kendrick, LLP; James D. Miller

(57) ABSTRACT

A method of operating an inverter including the steps of detecting the temperature of the at least one electrolytic capacitor; selecting at least one of a plurality of switching patterns based on the temperature of the at least one electrolytic capacitor; and generating a ripple current across the at least one electrolytic capacitor by operating the inverter from the at least one of the plurality of switching patterns for preheating of the at least one electrolytic capacitor.

10 Claims, 2 Drawing Sheets

(56) References Cited

U.S. PATENT DOCUMENTS

| | | | |
|---|---|---|---|
| 2008/0165472 A1* | 7/2008 | Chien | H01G 9/035 361/504 |
| 2009/0309525 A1* | 12/2009 | Kubo | H02M 1/4225 318/400.3 |
| 2010/0218527 A1* | 9/2010 | Kitagishi | F24F 11/008 62/228.5 |
| 2011/0011658 A1* | 1/2011 | Takizawa | B60L 3/0092 180/65.31 |
| 2011/0072841 A1 | 3/2011 | Arai et al. | |
| 2012/0213649 A1* | 8/2012 | Sumi | F04B 35/04 417/410.1 |

* cited by examiner

METHOD FOR OPERATING AN INVERTER OF AN ELECTRICAL REFRIGERANT COMPRESSOR MAKING USE OF DC LINK ELECTROLYTE CAPACITORS

CROSS-REFERENCE TO RELATED APPLICATION

This application claims priority to German Non-Provisional Patent Application Serial No. DE 10 2012 106 033.9 filed Jul. 5, 2012, hereby incorporated herein by reference in its entirety.

FIELD OF THE INVENTION

The invention concerns a method of operating an inverter of an electrical refrigerant compressor making use of DC link electrolytic capacitors. The method enables the operation of the inverter of the electrical refrigerant compressor at low temperatures for air conditioning or heating of motor vehicles by means of a heat pump switch of a refrigerant circulation.

BACKGROUND OF THE INVENTION

In motor vehicles, refrigerant circuits are outfitted with a heat pump function in order to make the heat from the surroundings or the waste heat from the vehicle usable for heating of the interior compartment of the vehicle at low outdoor temperatures. The refrigerant compressors in this case work in temperature ranges that substantially exceed the level of the usual vehicle air conditioning, especially at low outdoor temperatures.

DC link capacitors of various types can be used in inverters of the refrigerant compressors. Due to their high capacitance density, low price, ready availability, and ability to operate at high temperatures, DC link electrolytic capacitors have become widespread for use in electrical refrigerant compressors in motor vehicles.

The problem with electrolytic capacitors and especially for those types with high working voltage is that the capacitance decreases and the impedance increases greatly with dropping temperature. The effect even occurs exponentially at temperatures below −25° C. This confines the use of electrolytic capacitors to temperature ranges above −20° C.

But electrical refrigerant compressors in motor vehicles are also operated at temperatures below −20° C., especially when they are also designed for heat pump use, in order to utilize the ambient air in heating mode for the heating of the vehicle.

Alternatively, film capacitors or ceramic capacitors can also be used, but these have specific disadvantages. Film and especially ceramic capacitors have a substantially lower capacitance density as compared to electrolytic capacitors and are much more costly and larger than comparable electrolytic capacitors for high voltages and high capacitance values. Furthermore, film capacitors are usually not suitable for high temperatures of over 110° C. The disadvantage with large ceramic capacitors is that they are sensitive to impact and vibration, which can well occur in motor vehicles.

A method and a device for control of an electric motor are known from U.S. Pat. Appl. Pub. No. 2009/0039813 A1. The method for control of the motor voltage for the electric motor is realized by making use of an inverter. The inverter has an inverter circuit and a capacitor, which is connected to the input of the inverter circuit. The method realizes the control of the inverter circuit in a way that regulates the electric voltage for the electric motor in terms of the temperature of the capacitor.

Thus, the problem of the invention is to enable the use of relatively small and economical electrolytic capacitors even for temperature ranges below −20° C.

SUMMARY OF THE INVENTION

The problem of the invention is solved in particular by a method for operating an inverter of an electrical refrigerant compressor making use of DC link electrolytic capacitors by the following steps: detecting the temperature of the capacitors, selecting or creating a switching pattern for the inverter at a temperature less than or equal to the limit temperature TG, generating a ripple current for the preheating of the capacitors by means of the selected or created switching pattern.

As distinguished from the prior art, the warm up of the capacitors is done not by a control process via the motor operation, but by a preheating by means of a ripple current.

One embodiment of the invention consists in that the detecting of the temperature of the capacitors is done indirectly by detecting the temperature of the inverter. This is based on the assumption that the capacitors have the same or similar temperature to the inverter itself, since the heat balance and thus approximating of temperatures between capacitor and inverter occurs thanks to the spatial proximity and the good thermal conduction between the electrical components.

In another embodiment, a pulse width modulated signal with fixed pulse to pause ratio and differing for each phase is chosen as the switching pattern, wherein the modulation index is controlled by the DC link voltage and the inverter temperature. The typical modulation index is 5% to 40%, depending on the HV (high voltage) battery voltage and the inverter temperature.

According to another embodiment of the invention, the duration of a switching pattern tS is chosen from a matrix with empirical test data for a refrigerant compressor stored in a regulating and control unit in combination with the realtime temperature of the inverter or the realtime temperature of the capacitors.

An alternative embodiment of the invention calls for the duration of the switching pattern tS to be determined from the impedance of the capacitors and temperature-dependent measurable capacitor parameters. The ripple voltage produced by the ripple current across the capacitor impedance and superimposed on the HV dc voltage is measured on the direct current line.

The concept of the invention is to warm up the electrolytic capacitors by a special switching pattern so that the electrolytic capacitors find themselves in a temperature range where they can work optimally.

According to an embodiment of the invention, the cold electrolytic capacitors are actuated by a special switching pattern and warmed up by the ripple current flowing through them. This switching pattern does not turn the motor over, nor does it cause any fault-producing movement of the rotor. This pattern can be a pulse width modulated (PWM) signal, with fixed pulse to pause ratio and different for each phase. The modulation index can be controlled by the DC link voltage and the inverter temperature.

The duration of this operating mode must be carefully determined. On the one hand, the electrolytic capacitors must be warmed up enough to raise the capacitance and decrease the impedance; on the other hand, however, the electrolytic capacitors should not become prematurely aged or damaged on account of the ripple current.

In order to assure these boundary conditions, two alternative embodiments are proposed by the invention. First, empirical test data for a particular refrigerant compressor model is used together with the detecting of the real time temperature of the inverter. Alternatively, a real time evaluation is done for the electrolytic capacitor impedance by detecting of temperature-dependent, measurable electrolytic capacitor parameters. Whenever a particular threshold value of these parameters is passed, indicating a sufficiently low impedance, the inverter transitions into normal operating mode. The predetermined empirical test data can be implemented in the inverter in the form of a matrix, also known as a look-up table, in the regulating and control unit.

According to another alternative embodiment for the operating of the inverter in routine operation, the electrolytic capacitors already warmed up by the operation are placed under additional thermal load by the ripple current during the motor operation of the inverter in order to achieve the optimal operating temperature.

With the help of empirical test data for the particular refrigerant compressor model, together with a realtime evaluation of the current inverter temperature, an adequate warmup of the electrolytic capacitors can be monitored. If necessary, the switching pattern of the inverter can be modified so that the efficiency of the inverter decreases, thereby producing an additional heating of the inverter and, thus, of the electrolytic capacitors by the power dissipation.

Alternatively, a realtime evaluation of the current capacitor impedance can be used, for example, by measuring the voltage ripple on the direct current line, in order to ensure a suitable electrolytic capacitor temperature. In turn, the predetermined empirical test data is saved in the inverter in the form of a matrix in the regulating and control unit.

In a further embodiment, small, economical, and readily available electrolytic capacitors can be used to operate the inverter of the electrical refrigerant compressor over a broad temperature range from less than −25° C. to over 120° C., as demanded in the motor vehicle industry.

The benefits of the invention over the prior art thus consist in there being no influencing of the motor control. The preheating is done only by PWM pulse patterns and no motor movement occurs during the warmup phase.

BRIEF DESCRIPTION OF THE DRAWINGS

Further details, features and benefits of embodiments of the invention will emerge from the following description of sample embodiments making reference to the accompanying drawings. There are shown.

DETAILED DESCRIPTION OF EXEMPLARY EMBODIMENTS OF THE INVENTION

The following detailed description and appended drawings describe and illustrate various exemplary embodiments of the invention. The description and drawings serve to enable one skilled in the art to make and use the invention, and are not intended to limit the scope of the invention in any manner.

Figure 1:
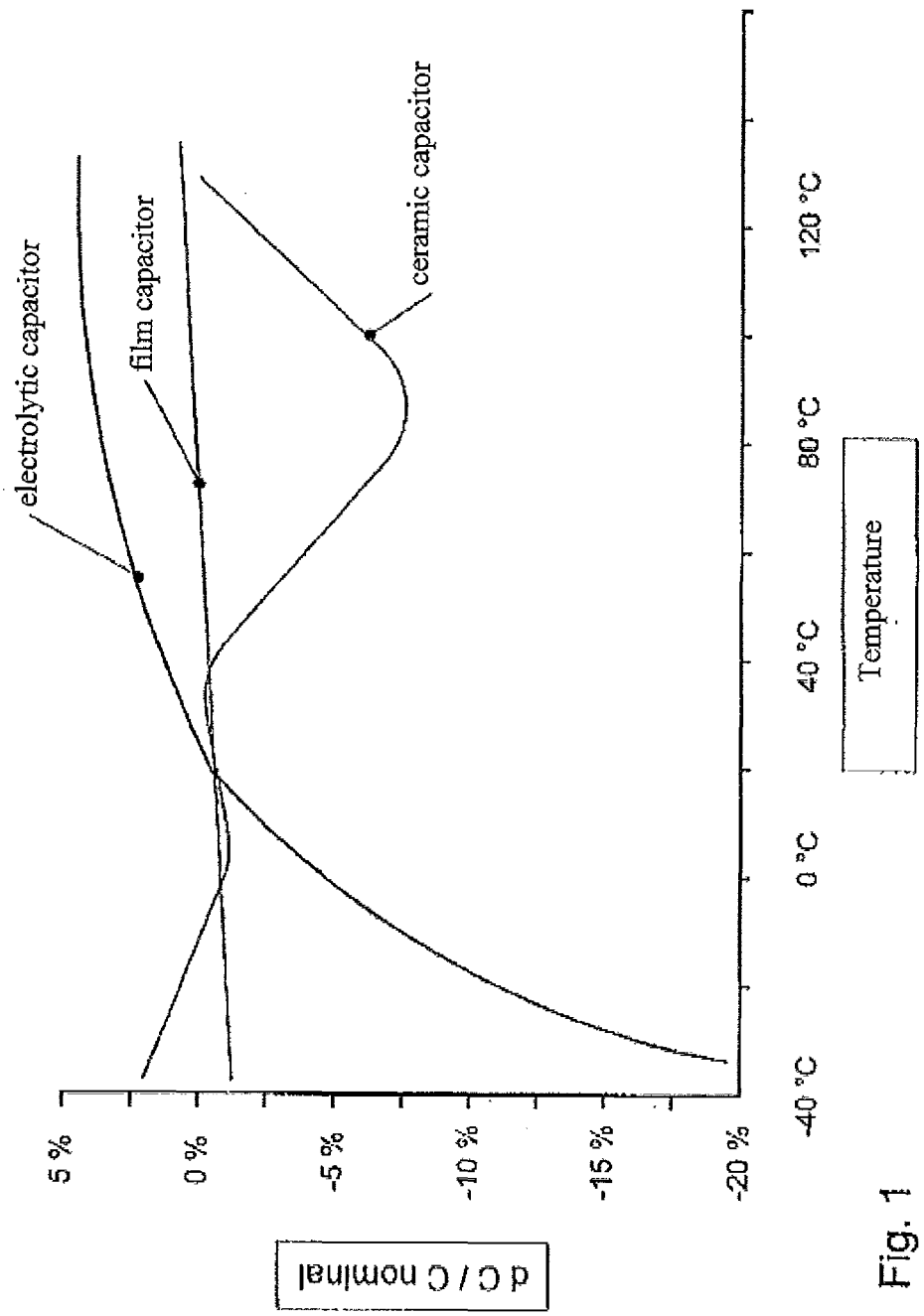
FIG. 1 illustrates a diagram of a normalized capacitance drop as a function of the temperature of different capacitor types.

FIG. 1 shows the problems of the dependency of the capacitance drop, normalized to the nominal capacitance, as a function of the temperature of the capacitor. In the case of the electrolytic capacitor, one notices the strong drop in capacitance at low temperatures as compared to film or ceramic capacitors.

Given this behavior, the problem for the use of electrolytic capacitors is to control the temperature of the capacitors to a temperature range with optimal functioning.

Figure 2:
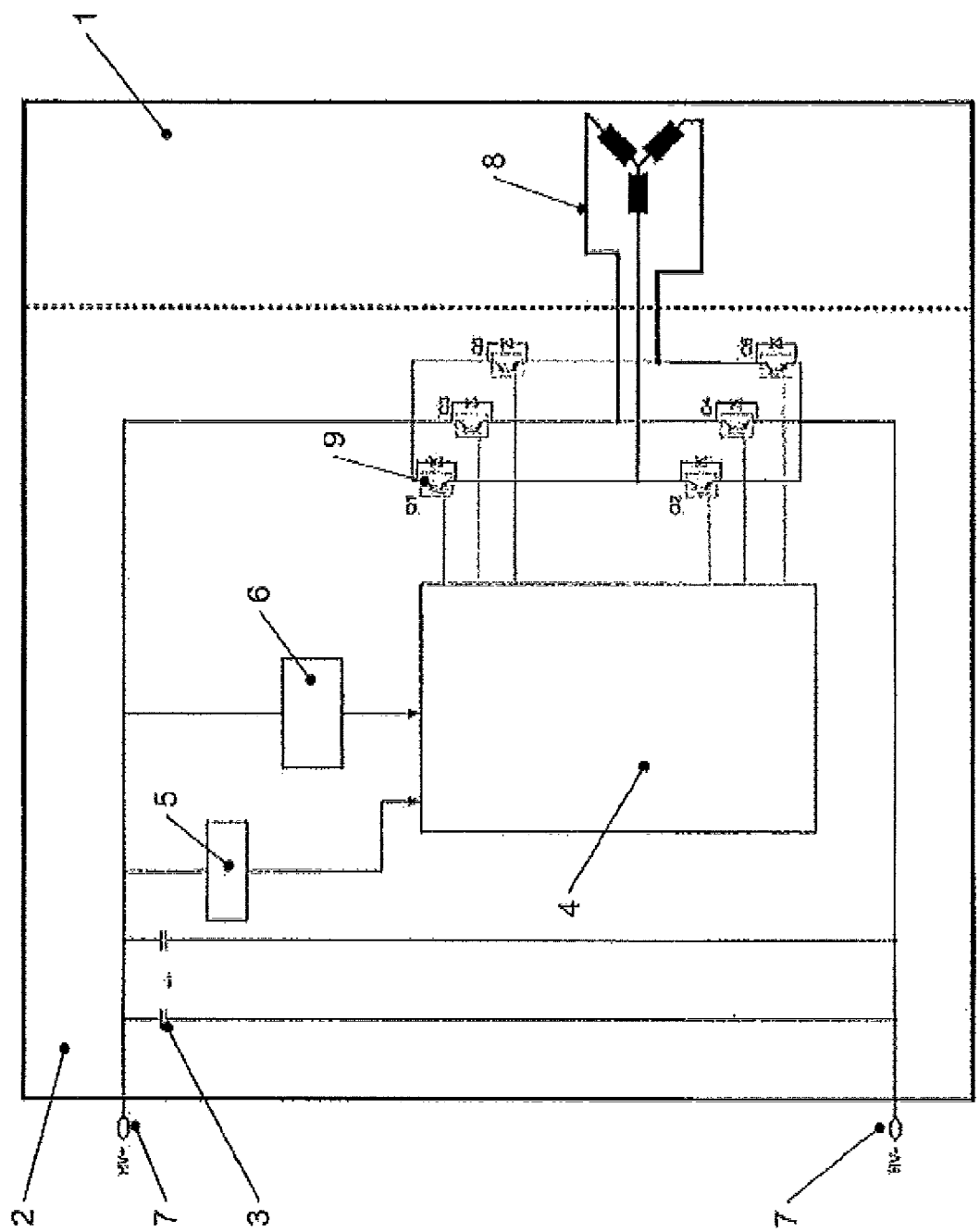
FIG. 2 illustrates schematic representation of a refrigerant compressor with an inverter.

FIG. 2 shows schematically a refrigerant compressor 1 with an electric motor 8 and an inverter 2 providing voltage to the motor 8. The voltage supply of the inverter 2 comes from a vehicle battery with direct current, connected to the HV terminals 7. In the inverter 2, one or more DC link circuits are formed with electrolytic capacitors 3. Furthermore, a regulating and control unit 4 is provided, in which the controlling and regulating of the motor 8 occurs via a microprocessor. A temperature sensor 5 furnishes information as to the temperature of the inverter 2 to the regulating and control unit 4. Another input of the regulating and control unit 4 comes via the do link voltage circuit monitoring device 6. The switching elements 9 are actuated from the regulating and control unit 4, thus supplying the motor 8 of the refrigerant compressor 1 with an alternating voltage.

From the foregoing description, one ordinarily skilled in the art can easily ascertain the essential characteristics of this invention and, without departing from the spirit and scope thereof, can make various changes and modifications to the invention to adapt it to various usages and conditions.

LIST OF REFERENCE SYMBOLS 1. refrigerant compressor
2. inverter
3. electrolytic capacitor
4. regulating and control unit
5. temperature sensor
6. dc link voltage circuit monitoring device
7. HV terminal
8. motor
9. switching elements

What is claimed is:

1. A method for operating an inverter of an electrical refrigerant compressor comprising the steps of:
   providing the inverter and at least one intermediate circuit having at least one electrolytic capacitor configured for electrical communication with a voltage supply of the inverter, the inverter responsive to each of a plurality of switching patterns to provide a ripple current across the at least one electrolytic capacitor;
   detecting a temperature of the at least one electrolytic capacitor;
   selecting at least one of the plurality of switching patterns based on the temperature of the at least one electrolytic capacitor;
   generating the ripple current across the at least one electrolytic capacitor by operating the inverter from the at least one of the plurality of switching patterns for preheating of the at least one electrolytic capacitor; and
   selecting a duration of the at least one of the plurality of switching patterns, wherein selecting the duration of the at least one of the plurality of switching patterns includes the step of selecting the duration from an impedance of the at least one electrolytic capacitor and a capacitor parameter.

2. The method according to claim 1, wherein detecting the temperature of the at least one electrolytic capacitor includes the step of detecting the temperature of the inverter to indirectly detect the temperature of the electrolytic capacitor.

3. The method according to claim 2, wherein detecting the temperature of the inverter includes the step of detecting the temperature of the inverter by a temperature sensor configured for electrical communication with the voltage supply.

4. The method according to claim 1, wherein the at least one of the plurality of switching patterns is configured to generate a pulse width modulated signal having a fixed pulse to pause ratio.

5. The method according to claim 4, further comprising the step of controlling a modulation index of the inverter by a voltage of the at least DC link circuit and a temperature of the inverter, wherein the modulation index is a percentage varying between 5% and 40%.

6. A method for operating an inverter of an electrical refrigerant compressor comprising the steps of:
   providing the inverter and at least one intermediate circuit having at least one electrolytic capacitor configured for electrical communication with a voltage supply of the inverter, the inverter responsive to each of a plurality of switching patterns to provide a ripple current across the at least one electrolytic capacitor;
   detecting a temperature of the at least one electrolytic capacitor by detecting a temperature of the inverter;
   selecting one of the plurality of switching patterns based on the temperature of the at least one electrolytic capacitor;
   selecting a duration of the at least one of the plurality of switching patterns, wherein selecting the duration of the at least one switching pattern includes the step of selecting the duration to increase the temperature of the at least one electrolytic capacitor and decrease an impedance of the at least one electrolytic capacitor; and
   generating the ripple current across the at least one electrolytic capacitor by operating the inverter from the at least one of the plurality of switching patterns for preheating of the at least one electrolytic capacitor.

7. The method according to claim 6, wherein detecting the temperature of the inverter includes the step of detecting the temperature of the inverter by a temperature sensor configured for electrical communication with the voltage supply.

8. The method according to claim 6, wherein the at least one of the plurality of switching patterns is configured to generate a pulse width modulated signal having a fixed pulse to pause ratio.

9. The method according to claim 8, further comprising the step of controlling a modulation index of the inverter by a voltage of the at least one intermediate circuit and a temperature of the inverter, wherein the modulation index is a percentage varying between 5% and 40%.

10. A method for operating an inverter of an electrical refrigerant compressor comprising the steps of:
   providing the inverter and at least one intermediate circuit having at least one electrolytic capacitor configured for electrical communication with a voltage supply of the inverter, the inverter responsive to each of a plurality of switching patterns to provide a ripple current across the at least one electrolytic capacitor;
   detecting a temperature of the at least one electrolytic capacitor by detecting a temperature of the inverter;
   selecting at least one of the plurality of switching pattern, wherein the at least one of the plurality of switching patterns is configured to generate a pulse width modulated signal having a fixed pulse to pause ratio on the temperature of the at least one electrolytic capacitor;
   selecting a duration of the at least one of the plurality of switching patterns, wherein selecting the duration of the at least one switching pattern includes the step of selecting the duration from an impedance of the at least one electrolytic capacitor and a capacitor parameter; and
   generating the ripple current across the at least one electrolytic capacitor by operating the inverter from the at least one of the plurality of switching patterns for preheating of the at least one electrolytic capacitor.

\* \* \* \* \*